US008189805B2

(12) United States Patent
Goodwin

(10) Patent No.: US 8,189,805 B2
(45) Date of Patent: May 29, 2012

(54) ALLPASS ARRAY

(75) Inventor: Michael M. Goodwin, Scotts Valley, CA (US)

(73) Assignee: Creative Technology Ltd, Singapore (SG)

( * ) Notice: Subject to any disclaimer, the term of this patent is extended or adjusted under 35 U.S.C. 154(b) by 1183 days.

(21) Appl. No.: 11/865,698

(22) Filed: Oct. 1, 2007

(65) Prior Publication Data

US 2008/0080728 A1 Apr. 3, 2008

Related U.S. Application Data

(60) Provisional application No. 60/827,619, filed on Sep. 29, 2006.

(51) Int. Cl.
*H04R 3/00* (2006.01)
*H03G 5/00* (2006.01)

(52) U.S. Cl. ................................ 381/92; 381/98; 381/97

(58) Field of Classification Search .................... 381/92, 381/182, 97, 98
See application file for complete search history.

(56) References Cited

U.S. PATENT DOCUMENTS

2006/0159288 A1* 7/2006 Stiles et al. .................. 381/111
2006/0256979 A1* 11/2006 Usui et al. ...................... 381/98

FOREIGN PATENT DOCUMENTS

EP 1694097 A1 * 8/2006

* cited by examiner

*Primary Examiner* — Vivian Chin
*Assistant Examiner* — David Ton
(74) *Attorney, Agent, or Firm* — Creative Technology Ltd

(57) ABSTRACT

Allpass arrays of arbitrary order are presented. The transducers in the arrays are configured with weights corresponding to the FIR approximation of an allpass filter such that a nearly uniform array response is provided.

20 Claims, 11 Drawing Sheets

Fig._1A
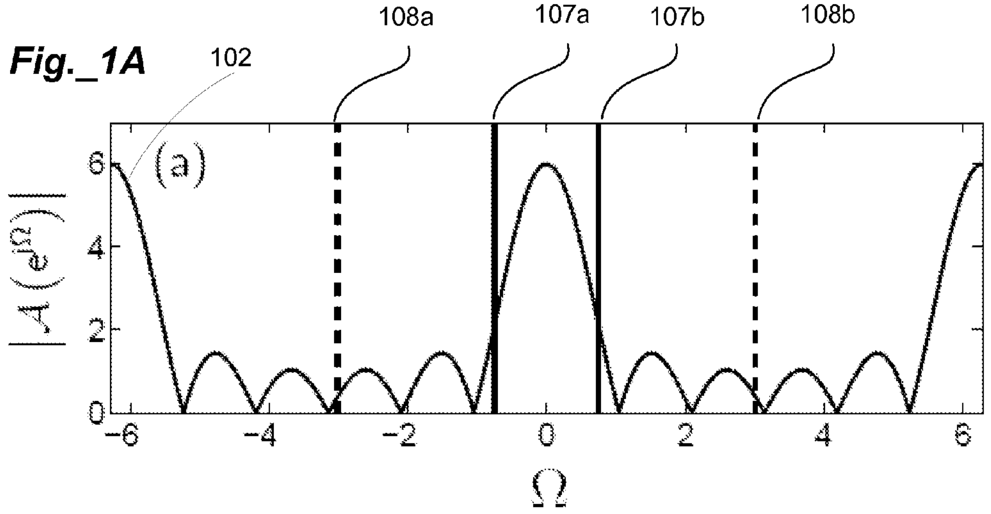
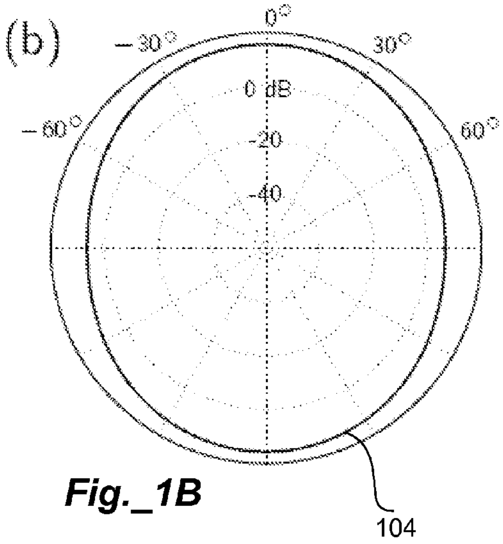
Fig._1B
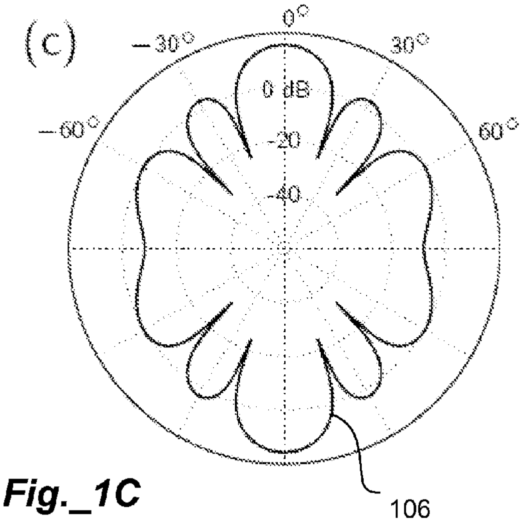
Fig._1C

Fig._8A
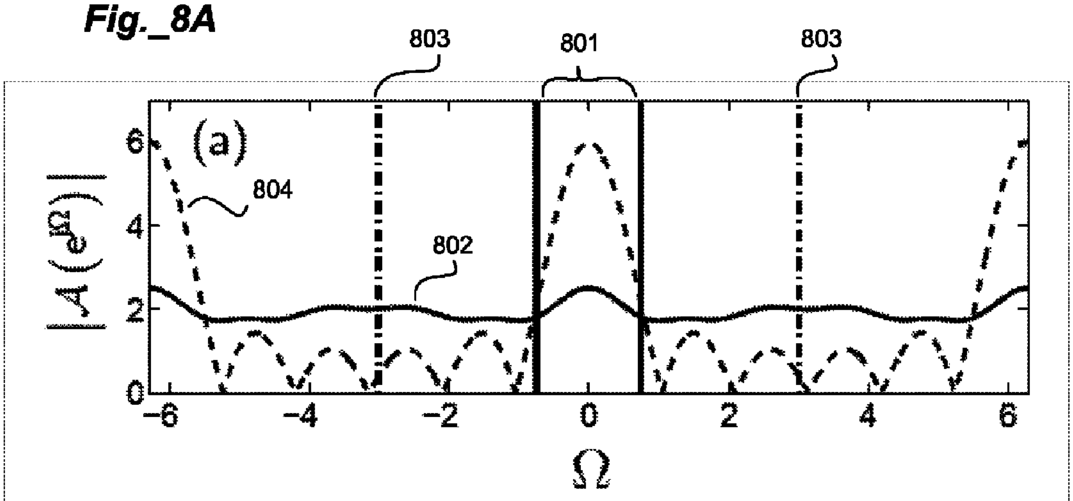
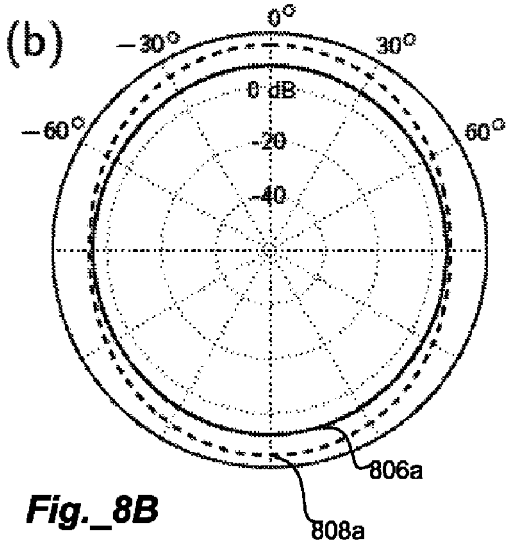
Fig._8B
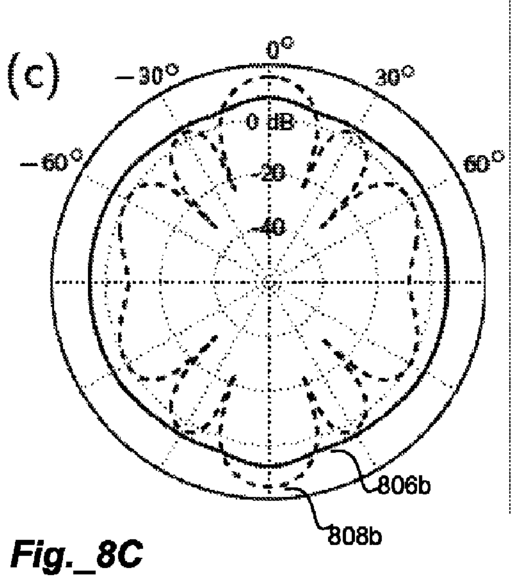
Fig._8C

*Fig._10A*
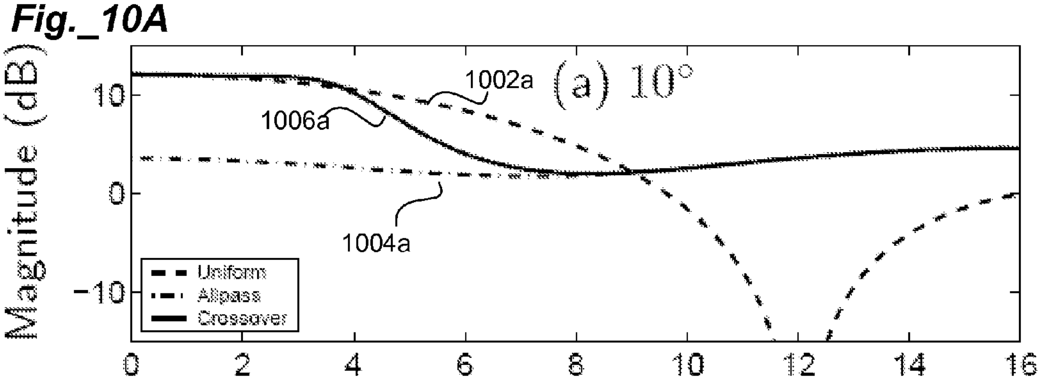
*Fig._10B*
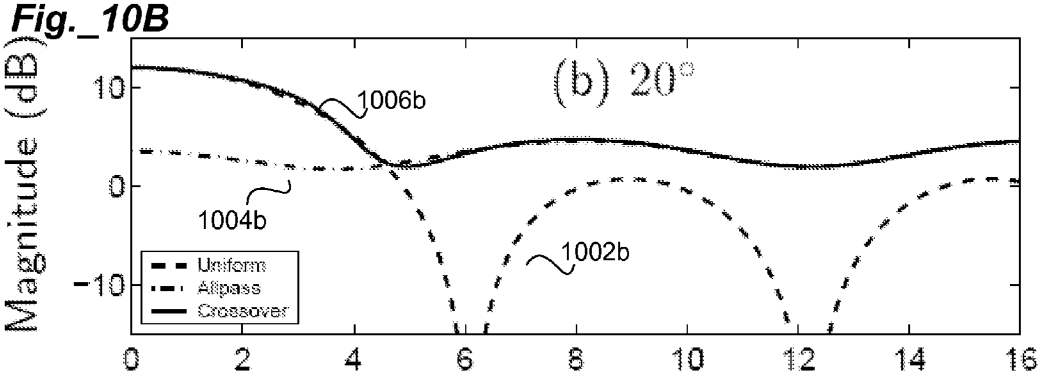
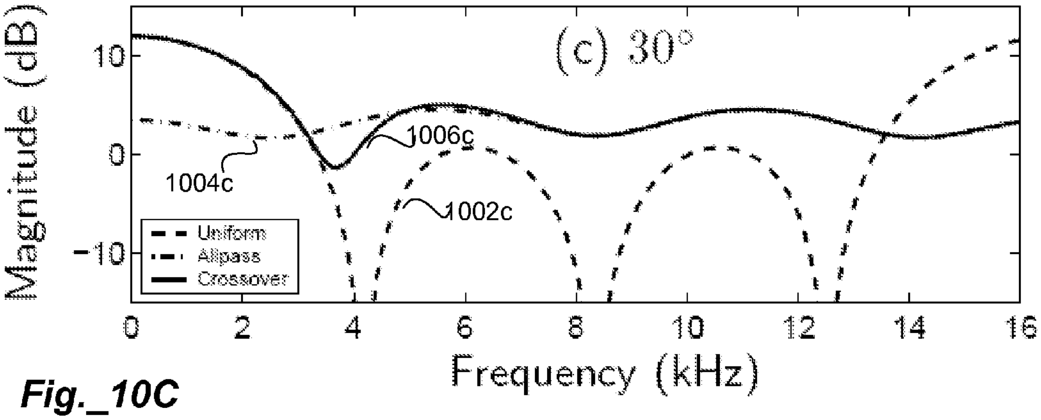
*Fig._10C*

ALLPASS ARRAY

CROSS-REFERENCES TO RELATED APPLICATIONS

This application claims priority from provisional U.S. Patent Application Ser. No. 60/827,619 filed Sep. 29, 2006, titled "Allpass Array" the disclosure of which is incorporated by reference in its entirety.

BACKGROUND OF THE INVENTION

1. Field of the Invention

The present invention relates to transducer arrays. More particularly, the present invention relates to transducer arrays having substantially direction-independent responses.

2. Description of the Related Art

Linear electroacoustic arrays are of interest for both consumer and professional audio applications for several reasons. In many scenarios, for instance in enhancing hands-free speech reception in an adverse environment, the inherent directivity of the array is the key advantage. In other cases, the directivity is indeed problematic, for instance in the use of a loudspeaker array for wide-area listening. For the application of audio reproduction, there is a benefit in using an array of drivers in that an array can achieve a higher-level acoustic output than any one of the individual constituent drivers. Rather than using a single larger driver to achieve a desired output level, a multiplicity of smaller drivers can be deployed; this array approach enables loudspeaker form factors that are commercially practical and attractive from an industrial design perspective. However, there is a drawback in such applications in that the frequency response of an array is angle-dependent such that the listening experience is significantly degraded at off-broadside positions unless the array is specifically configured to reduce such degradations.

A number of approaches have been proposed in the literature to counteract the variability of an array's response. These include filter network frequency invariant beamforming and Bessel weighting. Unfortunately, many of these approaches sacrifice gain in order to provide a relatively invariant response. What is desired is an array design that provides improved gain while limiting the variation in the response.

SUMMARY OF THE INVENTION

Various embodiments of the present invention are directed to the use of generalized allpass arrays. Since the far-field response of a uniformly spaced linear array is specified by a mapping of the DTFT (discrete-time Fourier transform) of the array weights, an FIR (finite-duration impulse response) approximation of an allpass filter gives weights which result in a nearly uniform array response. One embodiment provides a method for the design of arbitrary-order allpass arrays. Further embodiments include allpass arrays in cross-over-filtered configurations and in the implementation of efficient frequency-invariant beamformers.

In one particular embodiment, a transducer array configured for providing a uniform response is provided. The transducer array includes a first subarray and a second subarray, the first subarray configured for receiving a signal in a first frequency band (low frequency) and the second subarray configured for receiving a signal in a second band (high frequency). The first subarray is an unprocessed array (i.e. an array with equal weights applied to the respective transducer signals), preferably having uniformly spaced transducers, and the second subarray is an allpass-weighted array, preferably with uniform spacing. The subarrays are of the same length in one embodiment.

In another embodiment, a method of designing a transducer array having uniformly spaced transducers is provided. The method includes optimization for both gain and invariance parameters by minimizing the variation of the array response at off-broadside positions and maximizing the summation of the individual transducer gains.

According to yet another embodiment, a method of designing an array comprises selecting the number of array elements and then performing a search on a discrete grid to determine the weight set that satisfies a gain constraint and optimizes a response flatness measure.

According to yet another embodiment, a method of designing an array comprises selecting the number of array elements and then performing a search on a discrete grid to determine the weight set that satisfies a response flatness constraint and optimizes the array gain.

These and other features and advantages of the present invention are described below with reference to the drawings.

BRIEF DESCRIPTION OF THE DRAWINGS

FIG. 1 is an illustration of the frequency-dependent mapping of the DTFT to the far-field array response.

FIG. 8 is an illustration of the DTFT magnitude and polar response of an allpass-weighted array in accordance with one embodiment of the present invention.

FIG. 10 is an illustration of the frequency response at various angles of a crossover-filtered 4-element array in accordance with one embodiment of the present invention.

DETAILED DESCRIPTION OF PREFERRED EMBODIMENTS

Figure 2:
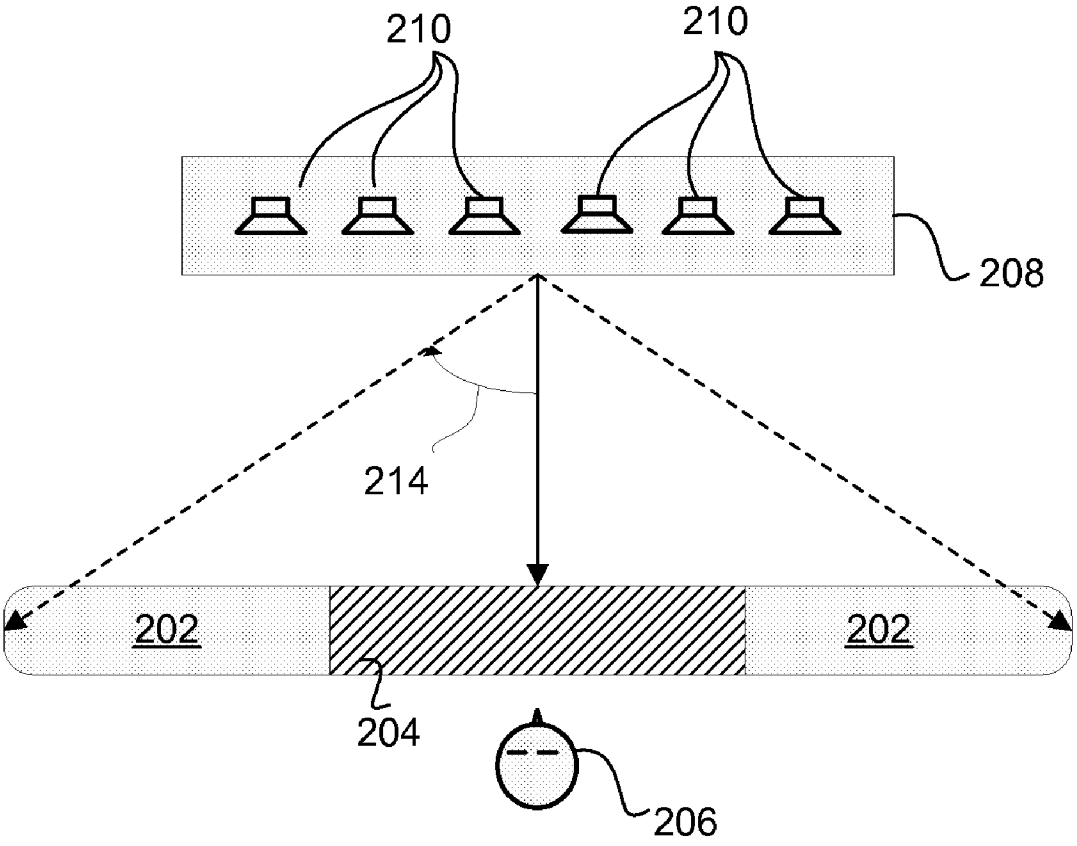
FIG. 2 is an illustration of the listening setup which depicts a loudspeaker array and listener positions at broadside and off-broadside.

Reference will now be made in detail to preferred embodiments of the invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known mechanisms have not been described in detail in order not to unnecessarily obscure the present invention.

It should be noted herein that throughout the various drawings like numerals refer to like parts. The various drawings illustrated and described herein are used to illustrate various features of the invention. To the extent that a particular feature is illustrated in one drawing and not another, except where otherwise indicated or where the structure inherently prohibits its incorporation of the feature, it is to be understood that those features may be adapted to be included in the embodiments represented in the other figures, as if they were fully illustrated in those figures. Unless otherwise indicated, the drawings are not necessarily to scale. Any dimensions provided on the drawings are not intended to be limiting as to the scope of the invention but merely illustrative.

Linear Array Fundamentals:

The far-field response of a uniformly spaced array corresponds to a discrete-time Fourier transform (DTFT) of the element weights. The far-field response of a linear array of N equi-spaced ideal omnidirectional elements can be expressed as $$A_{ideal}(\omega,\theta)=\sum_{n=0}^{N-1} a_n e^{-jn\omega\frac{d}{c}\sin\theta} \tag{1}$$

where n is an element index, the $a_n$ are the element weights, d is the inter-element spacing, c is the speed of sound, θ is the listening angle measured clockwise from broadside, and ω=2πf (where f is the frequency in Hz); for odd N, the elements are typically indexed with respect to the center of the array:

$$A_{ideal}(\omega,\theta)=\sum_{n=-M}^{M} a_n e^{-jn\omega\frac{d}{c}\sin\theta} \tag{2}$$

where M=(N−1)/2. Note that the designation ideal refers to an array of identical frequency-independent omnidirectional elements (although omnidirectional elements may not be functionally “ideal” for a particular array application). If the individual elements have frequency-dependent or angle-dependent responses, this elemental response V(ω,θ), if identical for all elements, can be simply incorporated into the response formulation:

$$A(\omega,\theta)=V(\omega,\theta)A_{ideal}(\omega,\theta) \tag{3}$$

This is the well-known principle of pattern multiplication, which will be revisited at several points in this specification.

The discrete-time Fourier transform of a sequence $a_n$ is defined as $$A(e^{j\Omega})=\sum_{n=0}^{N-1} a_n e^{-j\Omega n}. \tag{4}$$

Note that the array response A(ω,θ) and the DTFT $A(e^{j\Omega})$ can be readily distinguished notationally by their arguments. Comparing this to Eq. (1), we see that the far-field array response can be expressed in terms of the DTFT of the array weights as:

$$A_{ideal}(\omega,\theta)=A(e^{j\Omega})\big|_{\Omega=\omega\frac{d}{c}\sin\theta}. \tag{5}$$

According to Eq. (5), the DTFT of the array weights entirely determines the far-field response of a linear equi-spaced array; the response of the array for −π/2<θ<π/2, referred to as the visible range of the array, corresponds to the DTFT range −ωd/c<Ω<ωd/c. Note that the visible range corresponds to the frontal array response; the response of a linear array of omnidirectional elements is cylindrically symmetric around the axis of the array, so this angle range dictates the entire array response. If the array elements are directional, they alter the symmetry via pattern multiplication as in Eq. (3). An illustration of the frequency-dependent mapping of the DTFT to the far-field array response is given in FIG. 1. In particular, FIG. 1 illustrates the DTFT and array responses. Plot (a) shows the DTFT magnitude 102 of the sequence $a_n$={1, 1, 1, 1, 1, 1}, plotted against the DTFT radian frequency range Ω. Plot (b) shows the polar response 104 (in dB) at 1 kHz of a 6-element uniformly weighted equi-spaced array with an inter-element spacing of d=4 cm; this corresponds to the DTFT range bracketed by the solid lines 107*a*, 107*b* in plot (a), i.e. the main lobe of the DTFT. Plot (c) shows the response 106 at 4 kHz, which corresponds to the DTFT between the dashed lines 108*a*, 108*b* in (a).

Consider a uniformly weighted linear array with N=6 elements and d=4 cm inter-element spacing as illustrated in FIG. 1. FIG. 1(*a*) shows the DTFT of the corresponding length-6 sequence $a_n$={1, 1, 1, 1, 1, 1}; this sequence notation is used as shorthand for $$a_n=\begin{cases}1 & 0\le n\le 5\\ 0 & \text{otherwise.}\end{cases} \tag{6}$$

At f=1 kHz, the visible range is that part of the DTFT between the solid vertical lines 107*a*, 107*b* in FIG. 1(*a*). This is essentially just the main lobe of the DTFT spectrum; this main lobe is mapped into the entire frontal array response (the angular region −π/2<θ<π/2), so the corresponding directivity pattern, shown on a dB scale in FIG. 1(*b*), is relatively uniform, i.e. non-directional. At higher frequencies, some of the sidelobes of the DTFT spectrum are also mapped into the array response, so the directivity pattern exhibits a directional main lobe and lower-level sidelobes. This is depicted in FIG. 1(*c*) for f=4 kHz; this directivity pattern corresponds to the DTFT between the dashed vertical lines 108*a*, 108*b* in FIG. 1(*c*). As the frequency increases, more of the DTFT is mapped into the visible range, meaning that the main lobe becomes narrower and narrower. At sufficiently high frequencies ($\omega>\pi c/d$), more than one period of the $2\pi$-periodic DTFT is mapped into the array response; this condition of spatial aliasing is analogous to the frequency-domain aliasing that results from insufficient time-domain sampling.

FIG. 2 is an illustration of listening setup using a transducer array. A transducer array 208 comprises a plurality of transducer elements 210. The transducer elements may comprise any form of transducer. In a preferred embodiment, the transducers comprise loudspeaker drivers. Depending on a variety of parameters including the spacing of the drivers and the weights (i.e., the gains) applied to the signals fed to the respective drivers, the response from the array may vary, for instance, in accordance with the listening angle ($\theta$) 214. For example, for a listener 206 at a broadside position, such as in region 204, relatively flat responses can be expected under many different configurations of the array. Broadside positions can generally be referred to as those positions where the listening angle 214 approaches 0. That is, the broadside position can be defined as the locations substantially located by a perpendicular line from the center of the array to the listening field, the line in specific being perpendicular to a line formed by transducers in the linear array. The present invention solves many of the problems associated with off-broadside positions, such as those positions in region 202.

In typical array designs such as that used in the example of FIG. 1, the array weights $a_n$ correspond to a lowpass filter, meaning that in general the DTFT $A(e^{j\Omega})$ is large near $\Omega=0$ and small near $\Omega=\pi$. Spatially, the low-frequency passband of $A(e^{j\Omega})$ corresponds to having a main lobe around $\theta=0°$; and, as explained above, this main lobe becomes narrower as frequency increases based on the mapping $\Omega=(wd/c)\sin\theta$. This narrowing of the main lobe of the array response (often referred to as "beaming") was explained above by considering the angular response of the array at several fixed frequencies. This beaming can also be thought of with respect to the frequency response of the array at various fixed angles. At broadside ($\theta=0°$), the frequency response is constant:

$$A(\omega,\theta)=A(e^{j\Omega})\,|_{\Omega=0}=\sum_n a_n \tag{7}$$

Figure 5:
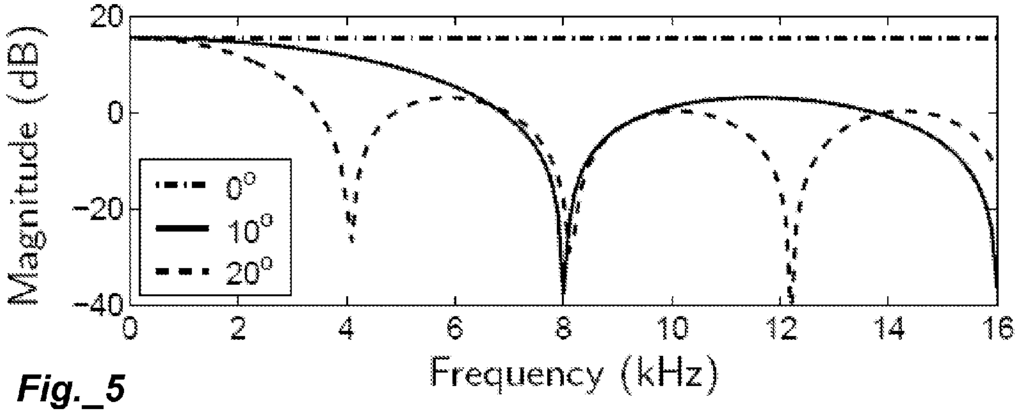
FIG. 5 is an illustration of the frequency response at various angles of a 6-element array with uniform weights and 4 cm spacing.

At off-broadside angles ($\theta\neq 0°$), the response of the array has a lowpass characteristic. At low frequencies, the main beam is wide and includes off-broadside angles, so the response at any angle is near its maximum; as frequency increases, the beam narrows such that off-broadside angles that are within the low-frequency beam are no longer in the main beam at high frequencies. This behavior is illustrated in FIG. 5, which shows the frequency response (at $\theta=0°$, 10°, and 20°) of a 6-element array with uniform weights and inter-element spacing d=4 cm. Note that as the angle from broadside increases, the frequency response is further compromised. In a loudspeaker array scenario, this means that such an array is unsuitable for a wide-angle listening area since off-broadside listeners would experience a significantly degraded signal.

Allpass Arrays:

For the loudspeaker array whose response is illustrated in FIG. 5, i.e. a uniformly weighted array with uniform spacing, an off-broadside listener experiences a significant lowpass characteristic as well as deep notches in the frequency response. This occurs because the high frequency response at off-broadside corresponds to the sidelobes of the DTFT of the array weights, in accordance with the mapping of Eq. (5). Indeed, any variation in the DTFT magnitude is manifested in the off-broadside array response. From that perspective, it is clear that one approach to designing an array with an invariant off-broadside response is to find weights $a_n$ whose DTFT is invariant (in magnitude), i.e. weights which correspond to an allpass filter:

$$|A(e^{j\Omega})|=1\,\forall\Omega. \tag{8}$$

Note that Eq. (8) assumes that the weights $a_n$ are normalized to sum to one; more generally, the invariance constraint for allpass weights is:

$$|A(e^{j\Omega})|=|A(e^{j\Omega})|_{\Omega=0}=\left|\sum_n a_n\right|. \tag{9}$$

Denoting the absolute sum of the weights by G and using Eq. (3), the response of an allpass array of directional, frequency-dependent elements is then a scaled version of the response of an individual element:

$$|A_{ideal}(\omega,\theta)|=G=\left|\sum_n a_n\right| \tag{10}$$

$$\Rightarrow |A(\omega,\theta)|=G|V(\omega,\theta)|. \tag{11}$$

In accordance with preferred embodiments of the present invention, the magnitude of the sum of the weights is maximized while maintaining the flat DTFT—so as to benefit from the multiplicity of array elements but not introduce any of the directionality typical of arrays. Of course, realizing an exact allpass filter requires both poles and zeros in the filter transfer function, meaning that the filter impulse response must be of infinite duration; the only FIR allpass filter is the one-tap response $a_n=\delta[n]$. (Or, trivially, $a_n=\delta[n-n_0]$.) A realizable nontrivial allpass array, i.e. an allpass array of finite length greater than one, is thus necessarily inexact; the DTFT of the finite-length weights an will always exhibit some variation. In general, the relationship of a sequence $a_n$ to the variation of the magnitude of its DTFT is highly complex and does not admit global optimization via standard optimization methods such as gradient descent. The problem of finding approximately allpass sequences thus calls for an exhaustive search methodology in which optimization is carried out over a large, discrete set.

In embodiments of the present invention, as applied to designing allpass arrays of loudspeakers, we are not only interested in reducing the variability of the array response but also in increasing the acoustic output—so as to get the most commercial benefit (in loudness) from the number of elements in the array. This leads to two design goals:

Invariance: minimize $\epsilon(a_n)$, the worst-case deviation of the array response from the broadside response:

$$\varepsilon(a_n)=\max_{\omega}\big||A(0,0)|-|A(\omega,0)|\big| \tag{12}$$

$$=\max_{\Omega}\big||A(e^{j0})|-|A(e^{j\Omega})|\big| \tag{13}$$

Gain: subject to the constraint $|a_n|\leqq 1$, maximize the array gain:

$$G(a_n) = \left|\sum_n a_n\right| = |A(e^{j0})| \quad (14)$$

Of course, these goals of minimizing $\epsilon(a_n)$, and maximizing $G(a_n)$ are not independent. Indeed, they are actually somewhat at odds with each other; for a given number of elements, generally, higher gain can only be achieved at the cost of increased response variation. According to one embodiment, the optimization includes selecting a minimum desired gain and then minimizing the response variation subject to the gain constraint. According to another embodiment, the optimization includes selecting a maximum allowable response variation and maximizing the gain subject to the variation constraint. Note that the broadside response is considered the nominal response with respect to which variations will be measured; also, recall that the broadside response corresponds to the array gain. Accordingly, in one embodiment, a method is provided for designing an optimized array based on evaluations of candidate arrays for both gain and invariance metrics.

One approach for deriving allpass array weights is to truncate the impulse response of a perfect IIR (infinite-duration impulse response) allpass filter to the desired length, i.e. the number of elements in the array; Bessel arrays, for example, are a subset of this much larger class of allpass arrays based explicitly on truncated IIR allpass filters. The immediate problem with truncation, however, is that the search space is vast: the topology and order of the ideal allpass filter must be selected, as well as the locations of the constituent poles and zeros. It is far more tractable to consider the problem from an FIR perspective: select the best N weights to minimize the response variation for the desired gain; or, select the best N weights to maximize the gain for the desired response invariance.

According to another embodiment, the direct design of finite-length sequences for allpass arrays is carried out as follows. First, the array length N, a discretization step size $\mu$, and a desired gain $G_0$ are fixed. The step size $\mu$ establishes the search space; each tap weight is allowed to take on values on a $\mu$-spaced grid ranging from −1 to 1, resulting in a total of $(2/\mu+1)^N$ possible weight sets. These candidates are considered exhaustively, which is computationally manageable for small arrays and reasonable discretization; for N=5 and $\mu$=0.1, the number of candidates is about $4.1\times10^6$. The exhaustive search is constructed as a set of N nested loops, with each nesting level corresponding to a different weight progressing through the grid of allowed values. In the inner loop, then, each candidate is evaluated with respect to the gain and invariance metrics.

Figure 3:
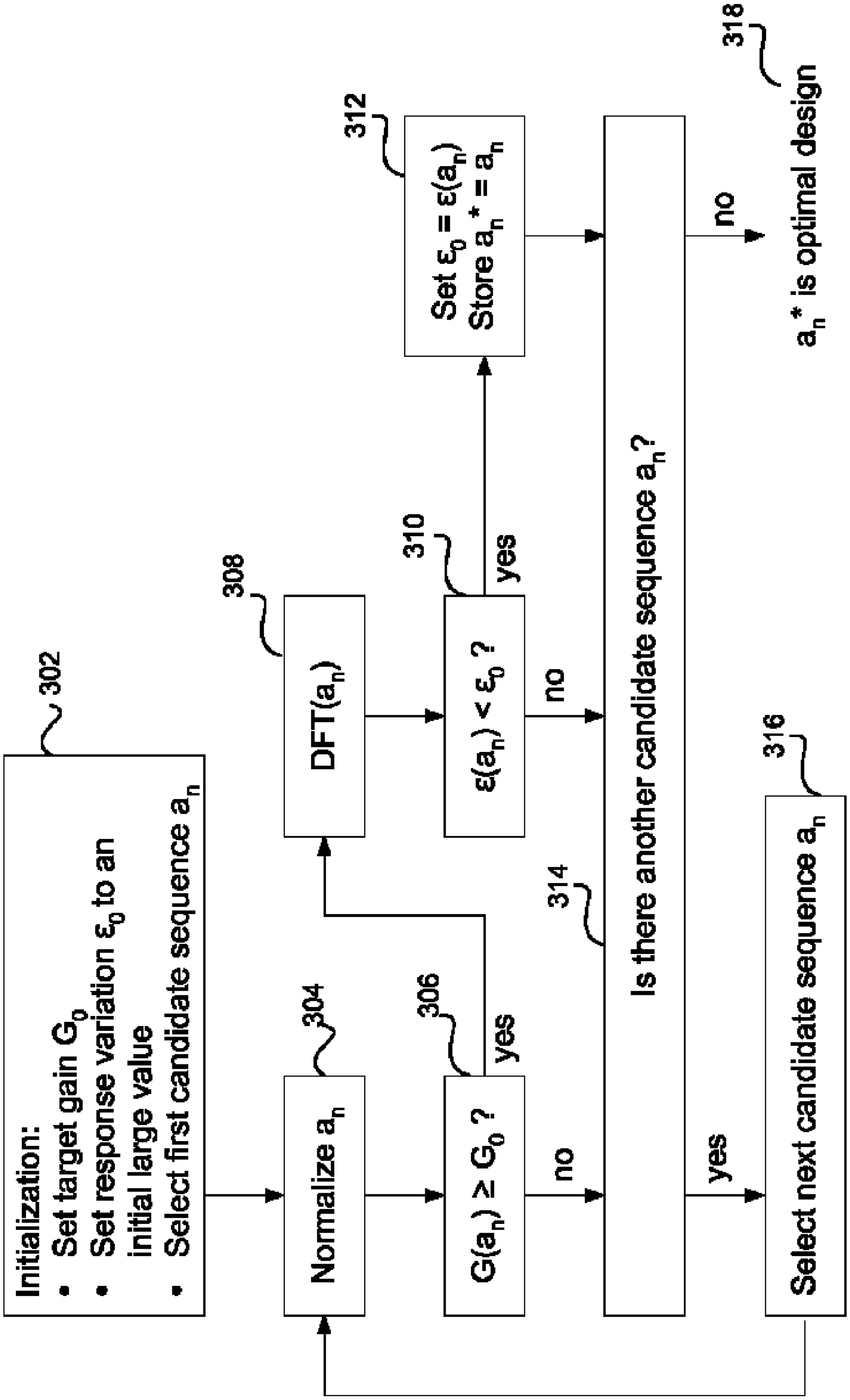
FIG. 3 is a flow chart for an allpass array design method which minimizes the variation of the array response subject to a constraint on the array gain, in accordance with one embodiment of the present invention.

FIG. 3 is a flow chart for such an allpass array design method which minimizes the variation of the array response subject to a constraint on the array gain. Initially, a first candidate sequence $a_n$ is selected in operation 302. "n" here refers to the number of elements in the sequence $a_n$ and is thus equal to the length of the array. In one embodiment, n is selected as an even number. Also in operation 302, the desired gain $G_0$ is set and the response variation $\epsilon_0$ is initialized to a large value. The candidate's gain $G(a_n)$ is determined after normalizing the weights with respect to the maximum absolute weight in the candidate set, the normalization occurring in operation 304. Then, if $G(a_n) \geqq G_0$, as determined in operation 306, the response variance is evaluated as follows: the discrete Fourier transform (DFT) of the normalized candidate sequence is computed (operation 308); the maximum deviation of the candidate's response is then computed as $$\varepsilon(a_n) = \max_k ||A[0]| - |A[k]|| \quad (15)$$

where A[k] is the DFT of the candidate weight sequence $a_n$. The candidate that satisfies the gain constraint and minimizes the variation $\epsilon(a_n)$ is retained as the optimal design choice, which may not be directly on the $\mu$-grid due to the normalization in the inner loop. This is illustrated in FIG. 3 where the error for the subject candidate sequence $\kappa(a_n)$ is compared to the minimum error $\epsilon_0$ determined previously (see operation 310). If the error for the current candidate is less than the minimum error determined previously, the current candidate is stored (see operation 312) and $\epsilon_0$ is set to $\epsilon(a_n)$. In operation 314, a determination is made as to whether other candidate sequences remain. If so, a next candidate sequence is selected in operation 316 and the flow proceeds to operation 304 where the new candidate sequence is normalized and the flow proceeds as described above. If not, the candidate sequence $a_n$* associated with the minimal error found is recognized as the optimal design in operation 318. Note that the DFT in the inner loop should preferably be sufficiently oversampled to provide an accurate representation of the DTFT and thereby an accurate characterization of the array response.

Figure 4:
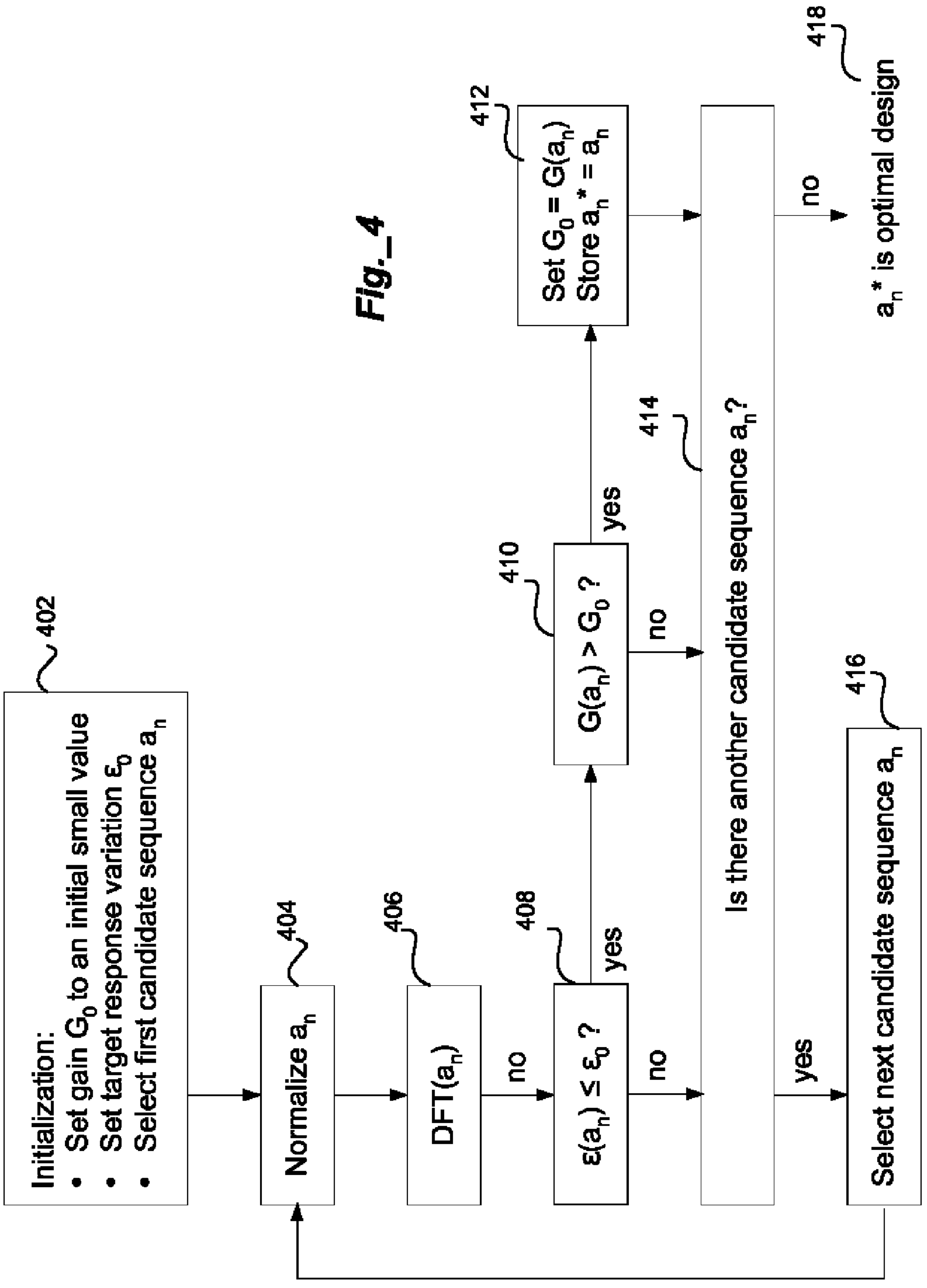
FIG. 4 is a flow chart for an allpass array design algorithm which maximizes the array gain subject to a constraint on the flatness of the array response, in accordance with one embodiment of the present invention.

FIG. 4 is a flow chart for an allpass array design algorithm which maximizes the array gain subject to a constraint on the flatness of the array response. The process begins at operation 402 where the target response variation $\epsilon_0$ is set and a first candidate sequence $a_n$ is selected; in operation 402, the gain $G_0$ is initialized to a small value. Next, in operation 404, the candidate sequence $a_n$ is normalized. That is, the weights are normalized with respect to the maximum absolute weight in the candidate set. In operation 406 the discrete Fourier transform (DFT) of the normalized candidate sequence is computed. In operation 408, the error for the selected candidate sequence $\epsilon(a_n)$ is evaluated with respect to the target response variation $\epsilon_0$. If the error is less than or equal to the target response variation, the process proceeds to operation 410 where the gain of the candidate sequence is evaluated with respect to the gain $G_0$. If the gain for the candidate set is greater than $G_0$, then in operation 412 gain $G_0$ is set to this new value and the candidate sequence associated with this gain is identified or stored. The process proceeds to operation 414 where a determination is made as to whether other candidate sequences remain for evaluation. If so, a next candidate sequence is selected in operation 416 and the flow proceeds to operation 404 where the new candidate sequence is normalized and the flow proceeds as described above. If there are no other candidate sequences remaining to be evaluated, the optimal design is determined as the identified candidate sequence $a_n$* in operation 418.

Figure 6:
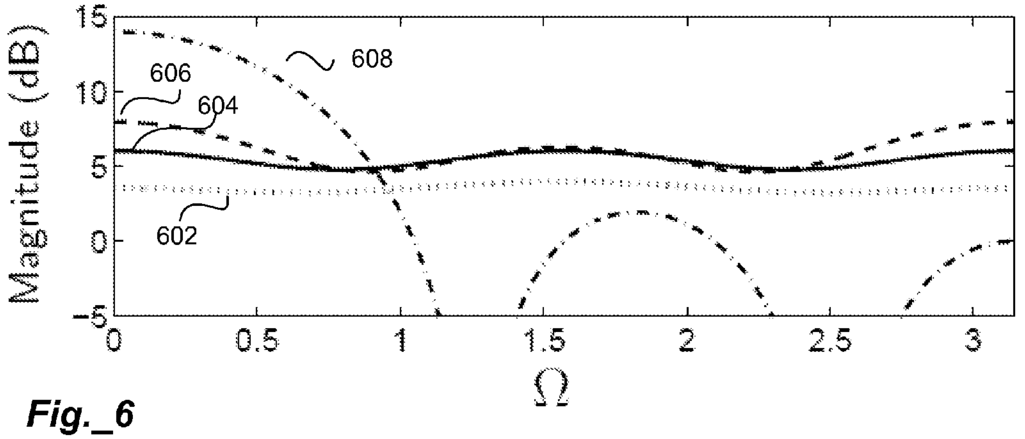
FIG. 6 is an illustration of the DTFT magnitude of optimal allpass sequences for N=5 in accordance with one embodiment of the present invention.

FIG. 6 depicts the DTFT magnitudes of optimal allpass sequences derived using the discrete search for N=5 and $\mu$=0.1 for several gain constraints. For $G_0$=2.0, this optimization yields the 5-element Bessel-array configuration {½, −1, 1, 1, ½}; for G=1.5, the optimal sequence is {¼, −¾, 1, ¾, ¼}; and for G=2.5, the optimal set is {¾, −1, 1, 1, ¾}. Note that the DTFT magnitude response of the optimal sequence becomes flatter as the gain constraint is relaxed, i.e. for lower design gains. The plot shows the DTFT magnitude of optimal sequences for N=5, $\mu$=0.1, and design gains $G_0$=1.5 (dotted—represented by plot line 602), $G_0$=2.0 (solid—represented by plot line 604), and $G_0$=2.5 (dashed—represented by plot line 606). The DTFT magnitude 608 of the uniform sequence {1, 1, 1, 1, 1} is shown for comparison (dash-dot).

Figure 7:
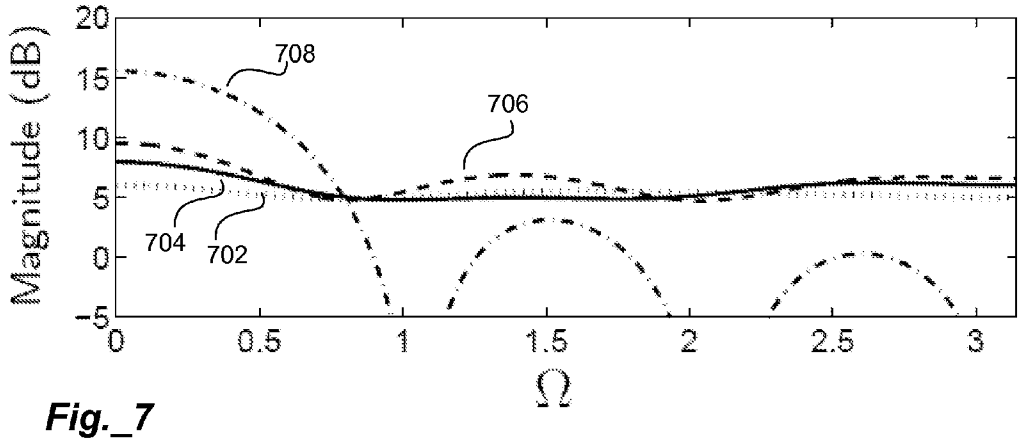
FIG. 7 is an illustration of the DTFT magnitude of optimal allpass sequences for N=6 in accordance with one embodiment of the present invention.

FIG. 7 depicts the results of the optimization search for N=6 and $\mu$=0.1 for target gains of 2.0, 2.5, and 3.0; the corresponding optimal sequences are {1/9, 4/9, 1, 1, −1, 4/9}, {5/8, −1, 1, 1, 5/8, 1/4}, {1, −1, 4/7, 1, 1, 3/7}, respectively. The plot shows the DTFT magnitude of optimal sequences for N=6, $\mu$=0.1, and design gains $G_0$=2.0 (dotted—represented by plot line 702), $G_0$=2.5 (solid—represented by plot line 704), and $G_0$=3.0 (dashed—represented by plot line 706). The DTFT magnitude 708 of the uniform sequence {1, 1, 1, 1, 1, 1} is shown for comparison (dash-dot). This demonstrates the existence of robust even-length allpass arrays; there is no restriction to odd-length designs in this procedure, as opposed to Bessel and other skew-symmetric designs.

FIG. 8 shows the mapping of the DTFT to polar responses at 1 kHz and 4 kHz for the optimal length-6 allpass sequence with gain 2.5; an inter-element spacing of 4 cm is assumed. The corresponding responses of a uniform 6-element array are included for comparison. Plot (a) shows the DTFT magnitude of the optimal length-6 allpass sequence {5/8, −1, 1, 1, 5/8, 1/4} (solid—represented by plot line 802) and of the uniform sequence {1, 1, 1, 1, 1, 1} (dashed—represented by plot line 804). The polar responses (in dB) of an allpass-weighted array (solid—represented by plot line 806*a*) and a uniformly weighted (dashed—represented by plot line 808*a*) array are shown in plot (b) at 1 kHz and (c) at 4 kHz (allpass-weighted represented by 806*b* and uniformly weighted represented by 808*b*); the inter-element spacing is d=4 cm. The polar plot in (b) corresponds to the DTFT range bracketed by the solid lines 801 in (a); plot (c) corresponds to the DTFT between the dash-dotted lines 803 in (a).

According to yet another embodiment, after the optimization carried out via either variation of the discrete search, a subsequent stage of gradient-based continuous optimization is carried out to search for a better local optimum in the neighborhood of the discrete-search result. Such descent optimization methods are insufficient for the full search due to the irregularity of the optimization contour, since they are prone to being trapped in local minima (which are abundant here). Note that if the first search is carried out with $\mu$=0.1, the improvement achieved by such a second stage is generally insignificant, at least in the design of short sequences.

As a final comment on the array design procedure, it should be noted that for cases where response invariance is only necessary for a limited angle and/or frequency range, the optimization can be tailored to account for such constraints. This is done by mapping the angle and frequency ranges to a range of $\Omega$ values and then only carrying out the search for the optimal $a_n$ over that range.

Approximate allpass sequences designed via any of the techniques described here can be used to realize linear electroacoustic arrays with uniform radiation (or reception) characteristics. The transducer arrays designed using embodiments of the present invention have been illustrated and described generally in terms of radiators such as loudspeakers but the scope of the invention includes all arrays of radiators and receptors, including without limitation microphone arrays and antenna arrays.

Figure 9:
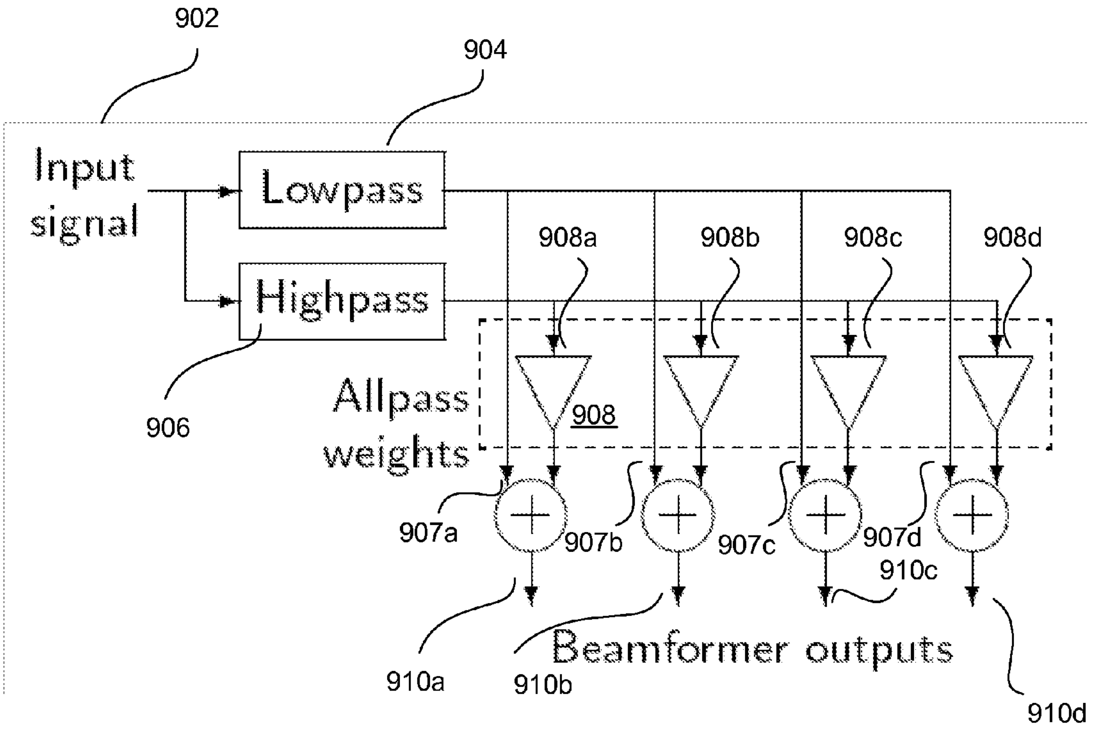
FIG. 9 is an illustration of a crossover-filtered 4-element array which is uniformly weighted at low frequencies and allpass-weighted at high frequencies in accordance with one embodiment of the present invention.

The allpass array design methods described above provide expanded design freedom with respect to previous methods. Allpass arrays designed via these methods serve as effective non-directional transducers. Beyond immediate use as a non-directional transducer, allpass arrays also have applications in broader systems as discussed in the following. FIG. 9 is an illustration of a crossover-filtered 4-element array which is uniformly weighted at low frequencies and allpass-weighted at high frequencies in accordance with one embodiment of the present invention.

Crossover-Filtered Arrays:

At sufficiently low frequencies (with respect to the array geometry), arrays do not exhibit directionality. This characteristic was described for the case of equi-spaced linear arrays earlier and explained mathematically using the DTFT mapping of Eq. (5); FIG. 1(*b*) illustrated that a 6-element uniformly weighted array with 4 cm spacing is essentially omnidirectional for frequencies up to 1 kHz. The response invariance provided by allpass weighting is thus not necessary at low frequencies. The allpass weighting is only needed at higher frequencies where the array geometry would otherwise lead to an unacceptable response at off-broadside angles. An efficient design utilizing these characteristics is a crossover-filtered design such as that depicted in FIG. 9.

The signal 902 to be broadcast by the array is filtered into low-frequency and high-frequency bands. At sufficiently low frequencies, the array is omnidirectional regardless of the tap weights, so uniform weighting is used to provide maximal output. Here, weights 907*a*, 907*b*, 907*c*, and 907*d* are uniform as applied to signal transmitted at the output of the low pass filter 904. Highpass filter 906 generates a signal corresponding to the high frequency band. The high band, on the other hand, is allpass-weighted to improve the high frequency off-broadside response. That is, the allpass array 908 applies allpass weights 908*a*, 908*b*, 908*c*, and 908*d* to the high band. The diagram illustrates sharing of the transducer elements. Here, rather than creating two separate subarrays having four elements or transducers in each, the signals are combined to generate beanformer output signals 910*a*, 910*b*, 910*c*, and 910*d* to only four transducers. This provides a more efficient structure. Of course, the invention is not so limited. The scope of the invention is intended to embrace at least the efficient design illustrated and the less efficient designs where no overlapping or sharing of transducers in the subarrays occurs. For illustration purposes, the crossover-filtered array is described with respect to splitting a signal into two bands. However, the scope of the invention is not so limited. The scope of the invention encompasses resolving the input signal into 3, 4, or more frequency bands and feeding the resolved frequency band signals into subarrays customized for that band. Preferably, whatever the degree of the multi-band design, a low frequency band will include uniform weighting to the transducer elements corresponding to the low frequency band. One key distinction between other multi-band array methods and the allpass crossover design is that in the allpass design the subarrays are preferrably of the same length.

FIG. 10 shows the frequency response at various angles ($\theta$=10° for FIG. 10A, $\theta$=20° for FIG. 10B, and $\theta$=30° for FIG. 10C) of a 4-element crossover-filtered array with 4 cm inter-element spacing. For comparison purposes, the magnitude plots for the uniform array are respectively shown as 1002*a*, 1002*b*, and 1002*c* in plots 10A, 10B, and 10C respectively; the magnitude plots for the allpass array are respectively shown as 1004*a*, 1004*b*, and 1004*c* in plots 10A, 10B, and 10C respectively; and the magnitude plots for the crossover array are respectively shown as 1006*a*, 1006*b*, and 1006*c* in plots 10A, 10B, and 10C respectively.

For low frequencies, the array is uniformly weighted; for high frequencies, the optimal allpass weights (3/8, −5/8, 1, 3/4) are used to avoid beaming. Note the difference in the low-frequency and high-frequency magnitude evident in the plots; the high-frequency response is attenuated since the allpass weights have a lower gain than uniform weights. It would defeat the purpose of the configuration to introduce a compensation filter to reduce the low-end gain; if an altogether flat response is needed, the allpass weights should be used exclusively. The idea in the crossover-filtered design is to avoid the attenuation of the allpass weights in the low-frequency band while leveraging their invariance in the high frequency band.

The crossover array processing can be interpreted as a per-element filtering operation. Denoting the filters by $H_{LO}$ and $H_{HI}$ and the allpass weights by $a_n$, the equivalent elemental filters are simply $$B_n(\Omega)=H_{LO}(\omega)+a_nH_{HI}(\omega) \quad (16)$$

These filters are markedly different from those in filter-network frequency-invariant beamformers, which are typically lowpass filters with progressively lower cutoff frequencies for elements further from the array center. Note that there is no practical benefit in such a per-element interpretation since it is more efficient to implement the allpass crossover scheme using the configuration in FIG. 9.

Composite Arrays:

In the following, we consider the use of allpass arrays to construct composite arrays which combine multiple subarrays; specifically, we consider using the allpass array framework to form an "array of arrays". We first discuss composite arrays based on a convolution property, and then consider an extension to the design of frequency-invariant beamformers.

One of the fundamental properties of the DTFT is that the transform of the convolution of two sequences is the product of the transforms of those sequences. For sequences $a_n$ and $b_n$, this can be expressed as $$a_n * b_n \overset{DTFT}{\Longleftrightarrow} A(e^{j\Omega})B(e^{j\Omega}) \quad (17)$$

where $$a_n * b_n = \sum_m a_m b_{n-m} = \sum_m b_m a_{n-m}. \quad (18)$$

The convolution corresponds to a sum of time-shifted and weighted versions of $b_n$ (in the former expression) or $a_n$ (in the latter). Applying Eq. (17) to linear equi-spaced arrays, we see that an array with tap weights $c_n$ constructed by convolving the sequences $a_n$ and $b_n$ will have a far-field response $$C(\omega,\theta)=A(\omega,\theta)B(\omega,\theta). \quad (19)$$

Thus, if $a_n$ is an allpass sequence, the composite array $c_n$ will exhibit the same directivity pattern as $b_n$, within a gain factor (and within the limits of the allpass approximation by a finite sequence). This is analogous to the cascade of an allpass filter $a_n$ with a filter $b_n$; the resulting filter of course has the same DTFT magnitude as $b_n$.

Figure 11:
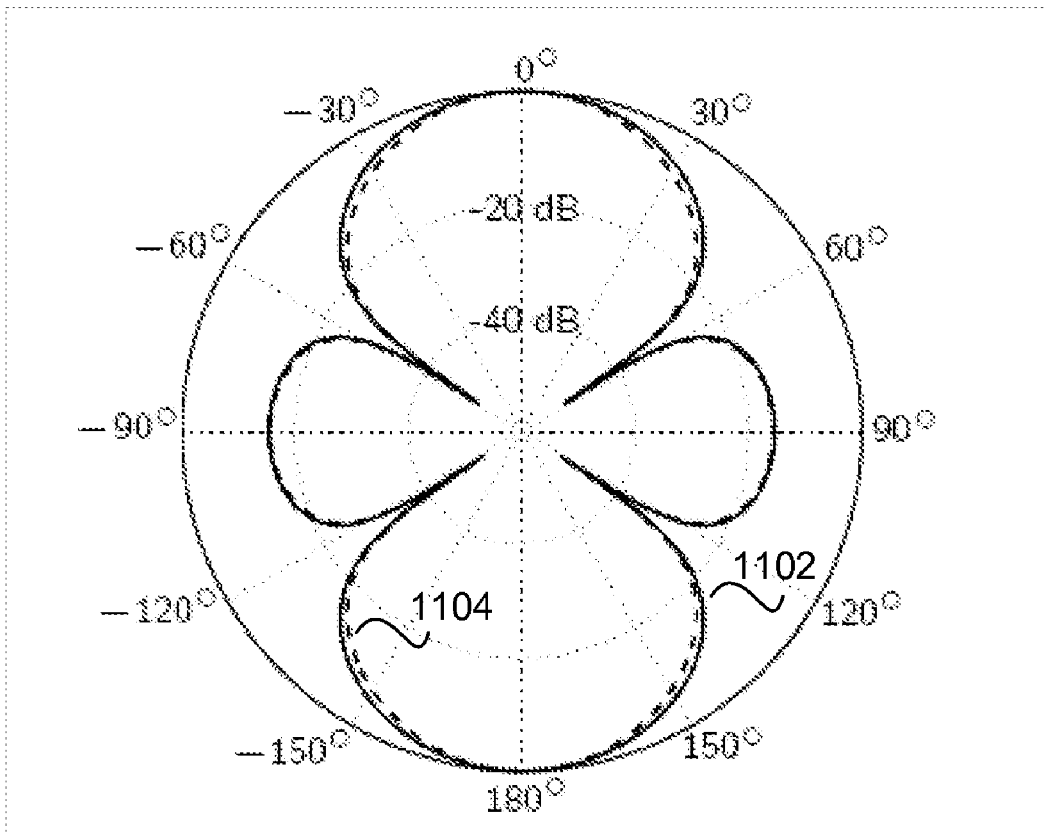
FIG. 11 is an illustration of a directivity pattern for a composite array in accordance with one embodiment of the present invention.

FIG. 11 shows directivity patterns for a uniformly weighted 5-element array (solid—represented by 1102) and an 8-element array formed by convolution with a length-4 allpass sequence (dashed—represented by 1104) at 2 kHz. The patterns have been normalized to their respective maxima to allow for a comparison of the patterns; the actual responses differ in magnitude due to the gain of the allpass component. Clearly, the directivity pattern of the composite array closely matches that of the 5-element subarray; there is a slight difference in the response shape because the length-4 sequence is only approximately an allpass filter. Note that the number of elements in the composite array in FIG. 11 is one less than the sum of the number of elements in the subarrays: $N=N_a+N_b-1$; this is the familiar result from FIR filter theory for the length of the convolution of two sequences. Consider the first convolution sum in Eq. (17); each successive shift of $b_n$ corresponds to another subarray shifted along the array axis (and weighted by $a_n$). These various shifted subarrays overlap to some extent, depending on the length of $b_n$ and the distribution of nonzero values in $a_n$. In the composite array, the overlapping elements of the subarrays are shared; the composite array weights, as derived by the convolution, correspond to a weighted sum of the respective subarray weights of these overlapping elements. When both subarrays in the convolution are allpass sequences, the result is also an allpass sequence, as in a cascade of allpass filters. Large allpass arrays can thus be readily designed via successive convolution of short subarrays. However, it should be noted that convolving two optimal allpass sequences does not necessarily yield an optimal larger array.

As mentioned earlier, one approach to counteract the inherent frequency dependence of the array response is to use a network of filters to process the array signals (instead of just applying frequency-independent gains); the idea in such methods is not to achieve an omnidirectional response, but rather to maintain a desired directivity pattern over a wide frequency range. Several filter design methods to achieve such frequency-invariant beamforming with uniform linear arrays have been discussed in the literature. For example, one design involves one filter for each array element, and the general effect is that the filters essentially shorten the array as frequency increases; also, there is typically a global compensation filter to flatten the broadside frequency response of the array. The central array element is usually unfiltered, so the overall number of filters needed is then N. To achieve effective frequency-invariant beamforming, these elemental filters as well as the compensation filter must generally be of high order. Methods for reducing the filtering requirements and the associated computational cost are thus of interest. In the following, we show how an allpass beamformer can be incorporated to reduce the complexity of frequency-invariant beamforming.

Figure 12:
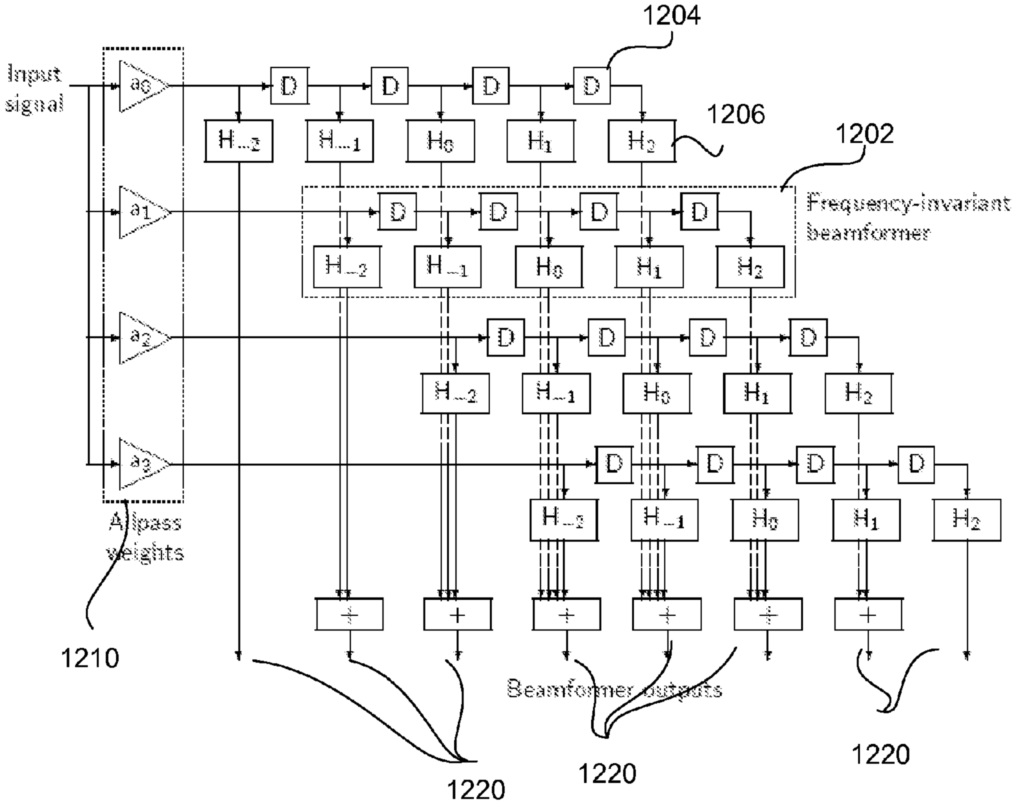
FIG. 12 is an illustration of a beamformer for a composite array in accordance with one embodiment of the present invention.

As shown in Eq. (11), an allpass array has the same magnitude response as an individual element in the array. Suppose now that each element in the allpass array is a frequency-invariant beamforming array. This "allpass array of arrays" scenario was described earlier with respect to the convolution of two arrays, wherein a subarray configured with static (frequency-independent) weights was augmented by convolution with an allpass sequence. Here, the subarrays are instead identically configured frequency-invariant beamformers. The net effect is that the composite array exhibits the same frequency-invariant beam pattern as one of the constituent subarrays. A beamformer constructed in this way is shown in FIG. 12; note that many of the subarray elements are shared in the composite array, and that the global compensation filter has been lumped into the elemental filters. FIG. 12 is a depiction of the beamformer for a composite array in which each allpass-weighted array element is a frequency invariant subarray, for example such as frequency invariant subarray 1202. The subarray output signals corresponding to coincident array elements are combined to form the final beamformer outputs. The allpass weight sequence 1210 includes $a_n$ allpass weights. The $H_n$ 1206 are frequency-invariant beamforming filters. Delays D (1204) are included to allow for beam steering. With regard to computational cost, there are $N_aN_b$ elemental filters in this processing arrangement, where $N_a$ is the length of the allpass weight sequence and $N_b$ is the length of the frequency-invariant subarray.

Figure 13:
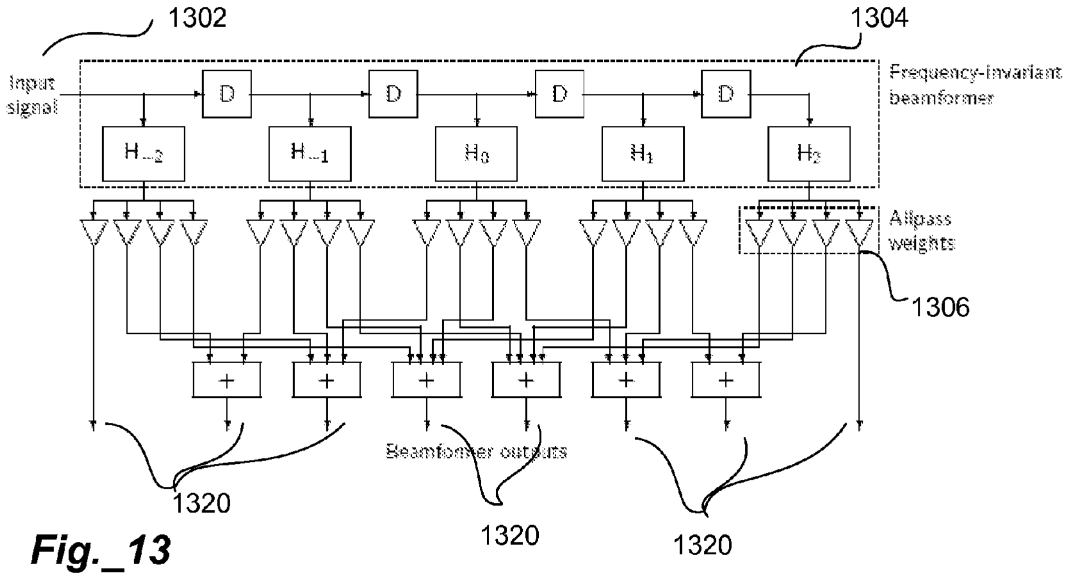
FIG. 13 is an illustration of an alternative implementation of the composite beamformer in accordance with one embodiment of the present invention.

For typical configurations, $N_aN_b$ is greater than $N_a+N_b-1$, which is the length of the composite array and hence the number of filters required in a direct frequency invariant beamformer. The computation required to implement the array-of-arrays beamformer in FIG. 12 can be substantially reduced by reordering the processing. Rather than implementing the structure as an allpass array of frequency-invariant arrays, it can be equivalently configured as a frequency-invariant beamformer 1304 of allpass subarrays 1306. This rearrangement is depicted in FIG. 13. Here, the number of filters has been reduced to $N_b$ at the cost of $N_aN_b$ additional multiplications.

Figure 14A:
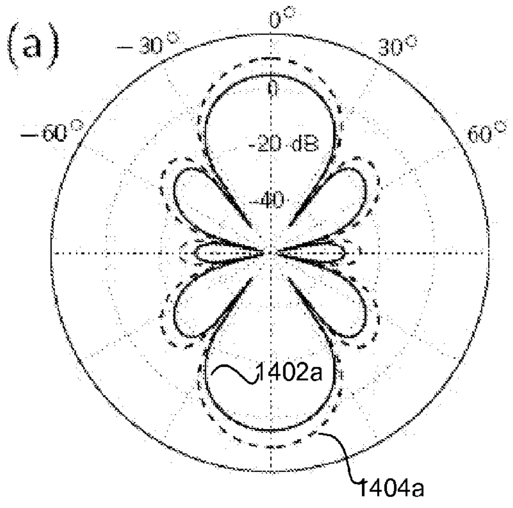
FIG. 14 includes plots illustrating the polar responses of a 9-element frequency invariant beamformer and a 13-element composite array in accordance with one embodiment of the present invention.
Figure 14B:
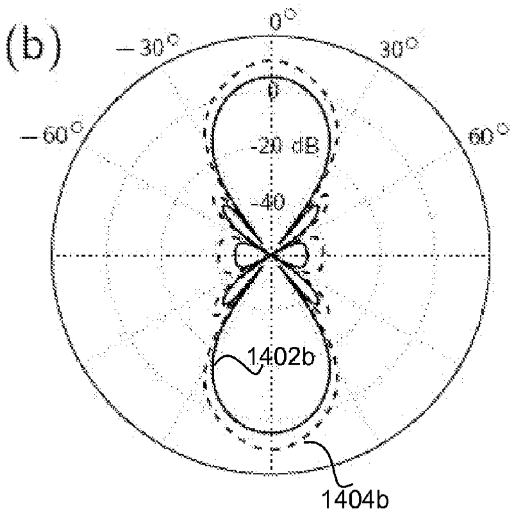

The response of a composite frequency-invariant beamformer is shown in FIG. 14 In the example array, the allpass sequence {½, −1, 1, 1, ½} is used to construct a 13-element array from a 9-element frequency-invariant beamformer. The responses of the composite array and the constituent subarray are both shown; the gain of the allpass sequence is included in the response, although in practice some scaling may be required to avoid overdrive in the composite structure. Note that since the allpass sequence is imperfect, some difference in the response shape is incurred, but this is insubstantial if the sequence is a reasonable allpass approximation. In further detail, FIG. 14 illustrates frequency-invariant beamforming using a composite allpass structure. The plots show the polar response of a 9-element frequency-invariant beamformer (solid—represented by 1402*a*, 1402*b*) and a 13-element array (dashed—represented by 1404*a*, 1404*b*) constructed as a composite of the 9-element array and a 5-element allpass sequence. Plot (a) is at 2 kHz and plot (b) is at 4 kHz; the inter-element spacing is 4 cm.

In the FIG. 14 example, 4 fewer filters are required in the composite realization of the beamformer than in a direct one-filter-per-element implementation; this demonstrates that the proposed allpass composite method can achieve effective frequency-invariant beamforming with less computation than in the direct beamformer design approaches previously described in the literature. However, it should be mentioned that a number of considerations are involved in the design of direct frequency-invariant beamformers, e.g. the array order required to achieve a target beam pattern within a certain tolerance. Such issues naturally also impact the design of composite frequency-invariant beamformers and in turn affect the extent of computational savings that can be achieved by the method.

The foregoing examples have illustrated the generation of composite arrays wherein the constituent subarrays were weighted with allpass weights, leading to the composite array response that matches than of an individual subarray (described as frequency-invariant beamformers), and alternatively where the individual subarray transducer elements were weighted with allpass weights and with the composite array structure configured as a frequency-invariant array. The scope of this embodiment of the invention is not to be limited to these types of filter structures but is intended to include at least all composite arrays wherein at least one of the overall composite structure or the constituent subarray is an allpass array.

The foregoing description describes several embodiments of linear arrays with uniform spacing and methods for designing such arrays. The variation of the array response had been evaluated with respect to a frequency-dependent and angle-dependent mapping of the DTFT of the array weights. In light of this mapping, array weights which are a good approximation of an allpass filter lead to an array response that matches than of an individual array element. In one embodiment, an allpass array design was described based on direct optimization of the weighting sequence; for a given target array gain, an exhaustive search on a discrete grid is carried out to find the weight set which satisfies the gain constraint and optimizes a response flatness measure. In another embodiment, for a given target response invariance, an exhaustive search on a discrete grid is carried out to find the weight set which satisfies the invariance constraint and optimizes the array gain. Examples were given to demonstrate the effective performance and the design freedom of the proposed approach. In other embodiments, applications of allpass arrays in crossover-filtered configurations and in efficient implementations of frequency-invariant beamformers were provided.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A transducer array configured for providing a uniform response from a signal comprising:

a first subarray; and a second subarray, wherein at least one of the first and second subarrays comprise transducers positioned at uniform spacings, the first subarray is a uniformly weighted array and the second subarray is an allpass-weighted array, wherein the weight values for the allpass weighted array are selected based on a combination of array gain and array response invariance metrics for at least the second subarray, wherein the gain metric comprises the magnitude of the sum of the second subarray weights and wherein the invariance metric comprises a measurement of the variation of the frequency response of the second subarray at off-broadside positions.

2. The transducer array as recited in claim 1 wherein the allpass weighted subarray is a Bessel array.

3. The transducer array as recited in claim 1 wherein the first subarray is configured to respond to signals in a first frequency band and the second array is configured to respond to signals in a second frequency band different from the first.

4. The transducer array as recited in claim 1 wherein the allpass weighted array comprises an even number of transducers.

5. The transducer array as recited in claim 3 wherein at least some of the transducers are common to the first and second subarrays.

6. The transducer array as recited in claim 5 wherein all of the transducers are common to the first and second subarrays.

7. The transducer array as recited in claim 3 further comprising a third subarray, wherein the weights applied to signals directed to the transducers in the third subarray are configured to respond to signals in a third frequency band.

8. A method of designing a configuration of uniformly spaced transducer elements in a linear allpass array, comprising:

determining the weights imposed on the transducer signals based on a gain metric and an invariance metric, wherein the gain metric comprises the magnitude of the sum of the array weights and wherein the invariance metric comprises a measurement of the variation of the frequency response of the array at off-broadside positions.

9. The method as recited in claim 8 wherein a target constraint for the invariance metric is selected and wherein the gain metric determined as the magnitude of the sum of the transducer element weights is maximized subject to the target invariance constraint.

10. The method as recited in claim 8 wherein a target constraint for the gain is selected and wherein the invariance metric is minimized subject to the target gain constraint.

11. A method for designing a linear array of uniformly spaced transducers, the method comprising:

selecting initially an array length N, a discrete set of allowed weight values, and a target comprising one of a desired a desired gain or a desired response variance;

determining the configuration of N weights which, when the target is a desired gain achieves the desired target gain and optimizes a response invariance metric and when the target is a desired response invariance, achieves the desired invariance and optimizes a response gain metric, wherein each weight is selected from the discrete set of allowed weight values.

12. The method as recited in claim 11 wherein determining the configuration which minimizes the response variation is constructed as a set of N nested loops with each nesting level corresponding to a different weight progressing through the discrete set of allowed values.

13. The method as recited in claim 11 wherein determining the configuration is performed using a bandlimited design optimization.

14. The method as recited in claim 13 wherein the bandlimited design optimization is performed by carrying out the search for the optimal invariance over a search range mapped from desired angle and frequency ranges.

15. A composite transducer array comprising:

a first subarray; and a plurality of identically configured secondary subarrays, wherein the first subarray is configured to combine the plurality of secondary subarrays, wherein at least one of the first subarray and the secondary subarrays is an allpass-weighted array and wherein the other of the first array and the secondary subarrays is a frequency-invariant beamformer.

16. The composite transducer array as recited in claim 15 wherein the first subarray is an allpass-weighted array and wherein each of the plurality of identically configured subarrays is a frequency-invariant beamformer.

17. The composite transducer array as recited in claim 15 wherein the first subarray is a frequency-invariant beamformer and wherein each of the plurality of identically configured subarrays is an allpass-weighted array.

18. The composite transducer array as recited in claim 15 wherein transducer elements are shared between at least some of the plurality of identically configured subarrays when said subarrays are combined using the first subarray.

19. The composite transducer array as recited in claim 15 wherein the allpass weighted array comprises an even number of elements.

20. The composite transducer array as recited in claim 15 wherein the weight values for the allpass weighted array are selected based on a combination of array gain and array response invariance metrics for at least the allpass weighted array, wherein the gain metric comprises the magnitude of the sum of the allpass array weights and wherein the invariance metric comprises a measurement of the variation of the frequency response of the allpass array at off-broadside positions.

* * * * *